(12) United States Patent
Seo et al.

(10) Patent No.: US 10,229,933 B2
(45) Date of Patent: Mar. 12, 2019

(54) FLEXIBLE DISPLAY INCLUDING METAL LAYER FORMED IN OPENING OF INSULATING LAYER

(71) Applicant: Samsung Display Co., Ltd., Yongin-si, Gyeonggi-do (KR)

(72) Inventors: Taean Seo, Yongin-si (KR); Taewoong Kim, Yongin-si (KR); Younggug Seol, Yongin-si (KR); Jinhwan Choi, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/178,429

(22) Filed: Jun. 9, 2016

(65) Prior Publication Data
US 2017/0040347 A1    Feb. 9, 2017

(30) Foreign Application Priority Data
Aug. 4, 2015  (KR) .................. 10-2015-0110236

(51) Int. Cl.
*H01L 27/12* (2006.01)
*H01L 51/52* (2006.01)
*H01L 27/32* (2006.01)

(52) U.S. Cl.
CPC ........ *H01L 27/1218* (2013.01); *H01L 27/124* (2013.01); *H01L 27/1248* (2013.01); *H01L 27/1259* (2013.01); *H01L 27/1262* (2013.01); *H01L 27/3276* (2013.01); *H01L 51/5246* (2013.01); *H01L 2227/323* (2013.01)

(58) Field of Classification Search
CPC ............... H01L 27/3276; H01L 27/124; H01L 2227/323; H01L 27/3262; H01L 51/56
USPC .......................................................... 257/72
See application file for complete search history.

(56) References Cited

U.S. PATENT DOCUMENTS

| | | | |
|---|---|---|---|
| 2009/0141223 A1* | 6/2009 | Hayashi | ................ G02F 1/1339 349/114 |
| 2011/0134018 A1 | 6/2011 | Seo et al. | |
| 2011/0303922 A1* | 12/2011 | Cho | ..................... H01L 27/1288 257/71 |
| 2013/0069853 A1 | 3/2013 | Choi | |
| 2014/0131683 A1* | 5/2014 | Kim | .................... H01L 51/5253 257/40 |

(Continued)

FOREIGN PATENT DOCUMENTS

| | | |
|---|---|---|
| KR | 10-2006-0059076 A | 6/2006 |
| KR | 10-2009-0041613 A | 4/2009 |

(Continued)

*Primary Examiner* — Andy Huynh
(74) *Attorney, Agent, or Firm* — F. Chau & Associates, LLC

(57) ABSTRACT

A flexible display and a method of manufacturing the same are disclosed. In one aspect, the display includes a flexible substrate including a display area and a peripheral area that surrounds the display area, and a thin-film transistor (TFT) layer formed on the flexible substrate and comprising an insulating layer and a TFT. The insulating layer is formed of an organic material and has an opening that surrounds the display area in the peripheral area; a pixel electrode electrically connected to the TFT. The display also includes a first metal layer formed in the opening and covering inner sides of the opening.

20 Claims, 9 Drawing Sheets

(56) References Cited

U.S. PATENT DOCUMENTS

2014/0203260 A1\* 7/2014 Ookawara ........... H01L 27/3276
  257/40
2015/0008406 A1 1/2015 Furuie
2015/0060778 A1\* 3/2015 Kim .................... H01L 27/3258
  257/40

FOREIGN PATENT DOCUMENTS

| KR | 10-2011-0062382 A | 6/2011 |
| KR | 10-2013-0031101 A | 3/2013 |
| KR | 10-2015-0004745 A | 1/2015 |

\* cited by examiner

FLEXIBLE DISPLAY INCLUDING METAL LAYER FORMED IN OPENING OF INSULATING LAYER

CROSS-REFERENCE TO RELATED APPLICATION

This application claims the benefit of Korean Patent Application No. 10-2015-0110236, filed on Aug. 4, 2015, in the Korean Intellectual Property Office, the disclosure of which is incorporated herein in its entirety by reference.

BACKGROUND

Field

The described technology generally relates to a flexible display and a method of manufacturing the flexible display.

Description of the Related Technology

Due to increased interest in flexible displays, much research is being conducted on them. In order to create a flexible display, a flexible substrate formed of a synthetic resin, etc., instead of a typical glass substrate, is used. It is difficult to manufacture the flexible substrate without using an underlying supporting substrate having sufficient rigidity. The flexible substrate is formed and subjected to various processing steps and eventually separated from the supporting substrate.

Typically, in a method of manufacturing a flexible display, ambient atmospheric moisture and oxygen penetrate the display unit, thereby damaging the materials, and thus, the reliability of flexible displays is lower than rigid displays.

SUMMARY OF CERTAIN INVENTIVE ASPECTS

The described technology generally relates to a flexible display and a method of manufacturing the flexible display, whereby external oxygen and moisture may be easily blocked from penetrating a display unit of the flexible display.

Another aspect is a flexible display that includes a flexible substrate having a display area and a peripheral area that surrounds the display area; a thin-film transistor layer on the flexible substrate and including an insulating layer and a thin-film transistor, wherein the insulating layer includes an organic material and has an opening that surrounds the display area in the peripheral area; a pixel electrode electrically connected to the thin-film transistor; and a first metal layer in the opening and covering inner sides of the opening.

The first metal layer may have a closed polygonal form or a closed curve form and may penetrate through the insulating layer.

The first metal layer may be filled in the opening.

A buffer layer including an organic material or an inorganic material may be further interposed between the flexible substrate and the thin-film transistor layer, and the opening may expose a portion of the buffer layer.

A second metal layer may be further disposed on the first metal layer.

The second metal layer may include same material as the pixel electrode.

The thin-film transistor may include a semiconductor layer, a gate electrode whose portion overlaps the semiconductor layer, and source and drain electrodes electrically connected to the semiconductor layer via contact holes, and a first material layer including same material as the semi-conductor layer may be further interposed between the flexible substrate and the first metal layer.

The opening may expose a portion of a top surface of the first material layer.

The first metal layer may include same material as the source and drain electrodes.

The insulating layer may be interposed between the semiconductor layer and the source and drain electrodes.

A second material layer may be further interposed between the first metal layer and the second metal layer.

A via layer may be further interposed between the thin-film transistor and the pixel electrode, and the first material layer may include same material as the via layer.

The flexible display may further include a thin-film encapsulation layer above the pixel electrode, wherein the thin-film encapsulation layer is on an overall surface of the flexible substrate and extends over a top surface of the first metal layer so as to cover the first metal layer.

Another aspect is a method of manufacturing a flexible display that includes operations of preparing a flexible substrate having a display area and a peripheral area that surrounds the display area; forming a thin-film transistor layer including a process of forming a semiconductor layer on the flexible substrate, a process of forming a gate electrode whose portion overlaps the semiconductor layer, a process of forming source and drain electrodes that are electrically connected to the semiconductor layer via contact holes, and a process of forming an insulating layer including an organic material, forming a pixel electrode electrically connected to the thin-film transistor; forming an opening that penetrates through the insulating layer on the peripheral area so that the opening surrounds the display area of the flexible substrate; and forming a first metal layer in the opening so that the first metal layer covers inner sides of the opening.

The forming of the first metal layer may include forming the first metal layer to have a closed polygonal form or a closed curve form so that the first metal layer may surround the display area of the flexible substrate.

The method may further include, before the forming of the thin-film transistor layer, forming a buffer layer of an organic material or an inorganic material on the flexible substrate, and the opening may be formed to expose a portion of the buffer layer or a portion of a top surface of a first material layer including same material as the semiconductor layer of the thin-film transistor.

The method may further include forming a second metal layer on the first metal layer, wherein the forming of the second metal layer and the forming of the pixel electrode are simultaneously performed.

The method may further include, between the forming of the source and drain electrodes and the forming of the pixel electrode, forming a via layer; and between the forming of the first metal layer and the forming of the second metal layer, forming a second material layer, and the forming of the via layer and the forming of the second material layer may be simultaneously performed.

The opening in the forming of the opening and the contact holes in the forming of the thin-film transistor may be simultaneously performed.

The forming of the insulating layer may be performed between the forming of the semiconductor layer and the forming of the source and drain electrodes.

Another aspect is a flexible display comprising: a flexible substrate including a display area and a peripheral area that surrounds the display area; a thin-film transistor (TFT) layer formed on the flexible substrate and comprising an insulating layer and a TFT, wherein the insulating layer is formed of an organic material and has an opening that surrounds the display area in the peripheral area; a pixel electrode electrically connected to the TFT; and a first metal layer formed in the opening and covering inner sides of the opening.

In the above flexible display, the first metal layer has a closed polygonal form or a closed curve form and penetrates through the insulating layer.

In the above flexible display, the first metal layer is completely fills in the opening.

The above flexible display further comprises a buffer layer formed of an organic material or an inorganic material, wherein the buffer layer is interposed between the flexible substrate and the TFT layer, and wherein the buffer layer contacts the first metal layer through the opening.

The above flexible display further comprises a second metal layer disposed over the first metal layer.

In the above flexible display, the second metal layer is formed of the same material as the pixel electrode.

In the above flexible display, the TFT comprises a semiconductor layer, a gate electrode having a portion overlapping the semiconductor layer, and source and drain electrodes electrically connected to the semiconductor layer via a plurality of contact holes, wherein the flexible display further comprises a first material layer formed of same material as the semiconductor layer, and wherein the first material layer is interposed between the flexible substrate and the first metal layer.

In the above flexible display, a portion of a top surface of the first material layer contacts the first metal layer through the opening.

In the above flexible display, the first metal layer is formed of the same material as the source and drain electrodes.

In the above flexible display, the insulating layer is interposed between the semiconductor layer and the source and drain electrodes.

The above flexible display further comprises a second material layer interposed between the first and second metal layers.

The above flexible display further comprises a via layer interposed between the TFT and the pixel electrode, and wherein the first material layer is formed of the same material as the via layer.

The above flexible display further comprises a thin-film encapsulation layer formed over the pixel electrode, wherein the thin-film encapsulation layer is formed over the entire surface of the flexible substrate and extends over a top surface of the first metal layer so as to cover the first metal layer.

Another aspect is a method of manufacturing a flexible display, the method comprising: preparing a flexible substrate having a display area and a peripheral area that surrounds the display area; forming a thin-film transistor (TFT) layer comprising: forming a semiconductor layer over the flexible substrate; forming a gate electrode having a portion overlapping the semiconductor layer; forming source and drain electrodes that are electrically connected to the semiconductor layer via a plurality of contact holes; and forming an insulating layer formed of an organic material. The method further comprises forming a pixel electrode electrically connected to the TFT; forming an opening that penetrates through the insulating layer in the peripheral area so that the opening surrounds the display area of the flexible substrate; and forming a first metal layer in the opening so that the first metal layer covers inner sides of the opening.

In the above method, the forming of the first metal layer comprises forming the first metal layer to have a closed polygonal form or a closed curve form so that the first metal layer surrounds the display area of the flexible substrate.

The above method further comprises, before the forming of the TFT layer, forming a buffer layer of an organic material or an inorganic material over the flexible substrate, wherein a portion of the buffer layer or a portion of a top surface of a first material layer is connected to the first metal layer through the opening, and wherein the first material layer is formed of the same material as the semiconductor layer of the TFT.

The above method further comprises forming a second metal layer over the first metal layer, wherein the forming of the second metal layer and the forming of the pixel electrode are simultaneously performed.

The above method further comprises: between the forming of the source and drain electrodes and the forming of the pixel electrode, forming a via layer; and between the forming of the first metal layer and the forming of the second metal layer, forming a second material layer, wherein the forming of the via layer and the forming of the second material layer are simultaneously performed.

In the above method, the forming of the opening and forming the contact holes in the forming of the thin-film transistor are simultaneously performed.

In the above method, the forming of the insulating layer is performed between the forming of the semiconductor layer and the forming of the source and drain electrodes.

DETAILED DESCRIPTION OF CERTAIN INVENTIVE EMBODIMENTS

Figure 1:
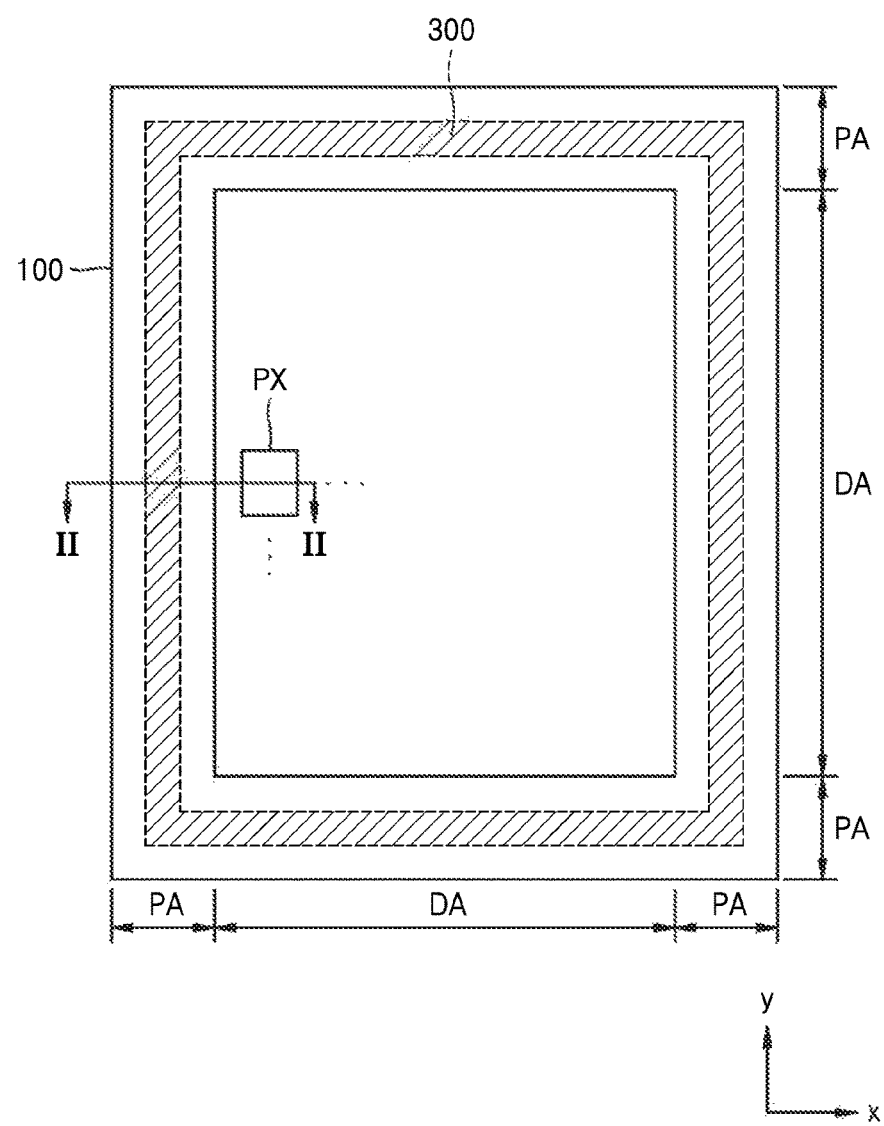
FIG. 1 illustrates a plan view of a flexible display, according to an exemplary embodiment.

As the described technology allows for various changes and numerous embodiments, particular embodiments will be illustrated in the drawings and described in detail in the written description. The effects and features of the described technology will now be described more fully with reference to the accompanying drawings, in which exemplary embodiments are shown. The described technology may, however, be embodied in many different forms and should not be construed as being limited to the embodiments set forth herein.

Those components that are the same or are in correspondence are rendered the same reference numeral regardless of the figure number, and redundant explanations are omitted.

Throughout the specification, while such terms as "first," "second," etc., may be used to describe various components, such components must not be limited to the above terms.

The above terms are used only to distinguish one component from another. Also, a singular form may include plural forms, unless there is a particular description contrary thereto.

Throughout the specification, terms such as "comprise" or "comprising" are used to specify existence of features and/or components described in the specification, not excluding the existence of one or more other features and/or one or more other components. It will be understood that when a layer, an area, a component, or the like is referred to as being "on" another layer, area, or component can be directly on another layer, area, or component or intervening layer, area, or component may also be present.

In the drawings, the thicknesses of layers and regions are exaggerated for clarity. For example, the thicknesses and sizes of elements in the drawings are arbitrarily shown for convenience of description, thus, the spirit and scope of the described technology are not necessarily defined by the drawings.

Hereinafter, in one or more exemplary embodiments, X-axis, Y-axis, and Z-axis may not be limited to three axes on a rectangular coordinate system but may be interpreted as a broad meaning including the three axes. For example, the X-axis, Y-axis, and Z-axis may be perpendicular to each other or may indicate different directions that are not perpendicular to each other.

Also, it should also be noted that in some alternative implementations, the steps of all methods described herein may occur out of the order. For example, two steps illustrated in succession may in fact be executed substantially concurrently or the two steps may sometimes be executed in the reverse order.

As used herein, the term "and/or" includes any and all combinations of one or more of the associated listed items. Expressions such as "at least one of," when preceding a list of elements, modify the entire list of elements and do not modify the individual elements of the list. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 2:
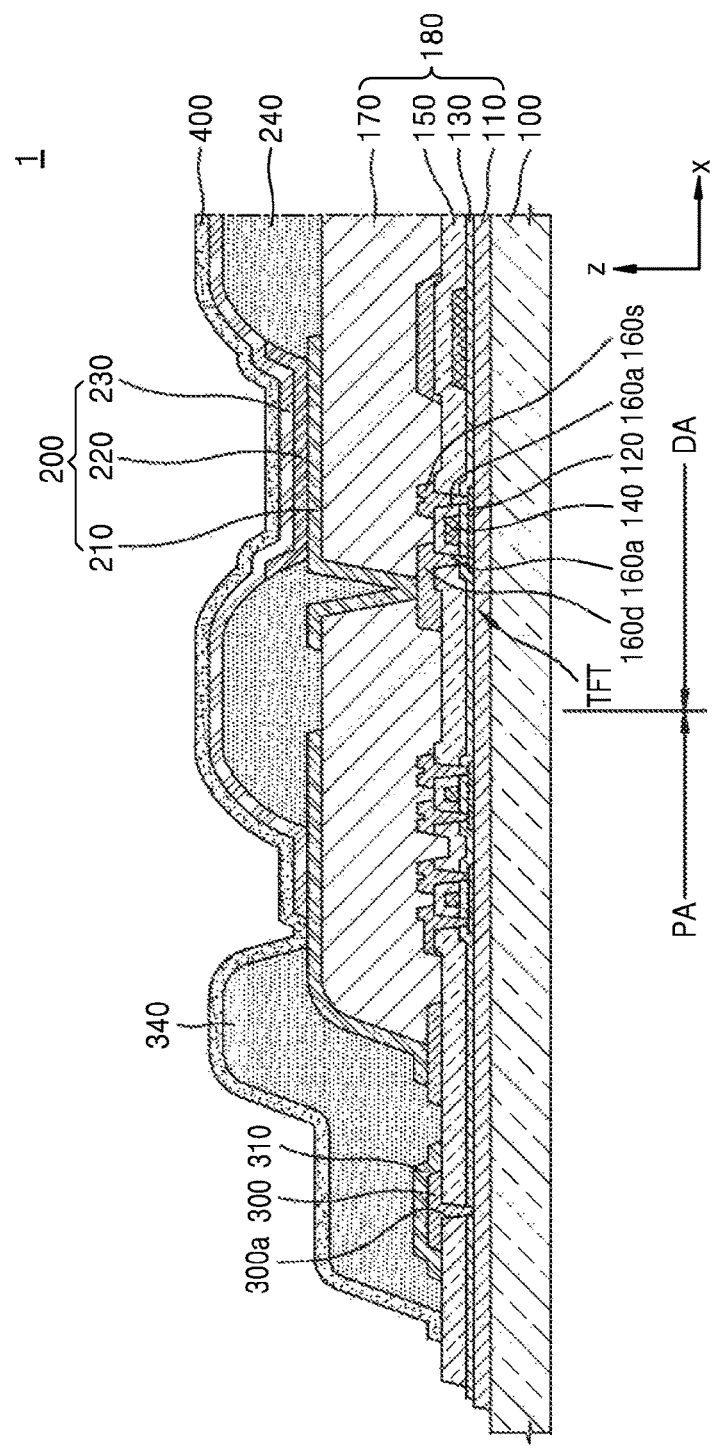
FIG. 2 illustrates a cross-sectional view of the flexible display of FIG. 1, taken along a line II-II.

FIG. 1 illustrates a plan view of a flexible display 1, according to an exemplary embodiment. FIG. 2 illustrates a cross-sectional view of the flexible display 1 of FIG. 1, taken along a line II-II.

Referring to FIGS. 1 and 2, the flexible display 1 according to the present exemplary embodiment includes a flexible substrate 100, a thin-film transistor layer 180, a first metal layer 300, and a second metal layer 310. The thin-film transistor layer 180 may be disposed on the flexible substrate 100 and include a thin-film transistor TFT and first and second insulating layers 130 and 150. Each of the first and second insulating layers 130 and 150 may include an organic material and a pixel electrode 210. An opening 300a may be formed in each of the first and second insulating layers 130 and 150. The first metal layer 300 and a second metal layer 310 may be disposed on a peripheral area PA of the flexible substrate 100.

The flexible substrate 100 may have a flexible characteristic and may be formed of various materials including a metal material, a plastic material such as polyethylen terephthalate (PET), polyethylen naphthalate (PEN), polyimide, or the like. The flexible substrate 100 may have a display area DA, in which a plurality of pixels are disposed, and the peripheral area PA that surrounds the display area DA.

Referring to FIG. 1, pixels PX are disposed on the display area DA of the flexible substrate 100. The pixels PX may have one of red, green, blue, and white colors and may be grouped to display an image.

The first metal layer 300 may be disposed on the peripheral area PA of the flexible substrate 100. As illustrated in FIG. 1, the first metal layer 300 has a closed polygonal form or a closed curve form so as to surround the display area DA. The first metal layer 300 may include a metal material and may be formed as a single layer or multistack layer.

Although not illustrated in FIG. 1, data wiring (not shown) and scan wiring (not shown) to supply electrical signals to the pixels PX on the display area DA, and a data driving unit (not shown) and a scan driving unit (not shown) to drive the data wiring and the scan wiring, respectively, may be disposed on the peripheral area PA. A pad unit (not shown) to deliver an image and a control signal to the data and scan driving units may also be disposed in the peripheral area PA.

In the present exemplary embodiment, the first metal layer 300 that is disposed on the peripheral area PA of the flexible substrate 100 may be designed not to interfere with other wires that form the data and scan driving units and the pad unit. For example, the first metal layer 300 may be formed on an outermost area of the flexible substrate 100 so as to entirely surround areas in which the data and scan driving units and the pad unit are formed. As another example, when the first metal layer 300 that surrounds the display area DA partly overlaps lines included in the data and scan driving units and the pad unit, in order to prevent the first metal layer 300 from interfering with various types of lines disposed on the peripheral area PA, the overlapping lines may be formed on different layers, may be formed with a trench structure, or may be formed by using one of various methods.

Referring to FIG. 2, the thin-film transistor layer 180 may be disposed on the flexible substrate 100. The thin-film transistor layer 180 may include the thin-film transistor TFT and a plurality of insulating layers. The pixel electrode 210 that is electrically connected to the thin-film transistor TFT may be disposed on the thin-film transistor layer 180. The thin-film transistor layer 180 may be an organic light-emitting diode (OLED) display or a liquid crystal display (LCD). In the present exemplary embodiment, it is assumed that the thin-film transistor layer 180 is included in an OLED display.

The thin-film transistor TFT includes a semiconductor layer 120 formed of amorphous silicon, polycrystalline silicon, or an organic semiconductor material, a gate electrode 140, a source electrode 160s, and a drain electrode 160d. For insulation purposes, the first and second insulating layers 130 and 150 may be disposed between the semiconductor layer 120 and the gate electrode 140, the source electrode 160s, and the drain electrode 160d. Hereinafter, a general structure of the thin-film transistor TFT is described.

First, a buffer layer 110 may be disposed on the flexible substrate 100 so as to planarize a top surface of the flexible substrate 100 or to prevent penetration of foreign substances into the semiconductor layer 120 of the thin-film transistor TFT, and the semiconductor layer 120 may be disposed on the buffer layer 110. The buffer layer 110 may be formed as a single layer or multistack layer including silicon oxide or silicon nitride.

The gate electrode 140 is disposed on the semiconductor layer 120, and in response to a signal applied to the gate electrode 140, the source electrode 160s and the drain electrode 160d are electrically connected. In consideration of adhesion with an adjacent layer, surface planarization of a stacked layer, formability, etc., the gate electrode 140 may be formed as a single layer or a multistack layer formed of at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

In this regard, the first insulating layer 130 may be interposed between the semiconductor layer 120 and the gate electrode 140. The first insulating layer 130 may be a gate insulating layer arranged to assure insulation between the semiconductor layer 120 and the gate electrode 140, and may be formed of an insulating material. For example, in order to improve flexibility of the flexible display 1, the first insulating layer 130 may include an organic insulating material such as an acryl-based organic material or benzocyclobutene (BCB).

The second insulating layer 150 may be disposed on the gate electrode 140 and may function as an interlayer insulating layer that insulates the gate electrode 140 from the source electrode 160s and the drain electrode 160d. In order to improve flexibility of the flexible display 1, the second insulating layer 150 may include an organic insulating material such as an acryl-based organic material or bnzocyclobutene (BCB).

The source electrode 160s and the drain electrode 160d are disposed on the second insulating layer 150. The source electrode 160s and the drain electrode 160d are electrically connected to the semiconductor layer 120 via contact holes 160a that are formed in the second insulating layer 150 and the first insulating layer 130. In consideration of conductivity, the source electrode 160s and the drain electrode 160d may be formed as a single layer or a multistack layer formed of at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

Although not illustrated, a protective layer (not shown) may cover the thin-film transistor TFT so as to protect the thin-film transistor TFT having the aforementioned structure. The protective layer may be formed of an inorganic material such as silicon oxide, silicon nitride, or silicon oxynitride.

A via layer 170 may be disposed on the flexible substrate 100. In this regard, the via layer 170 may be a planarization layer or a protective layer. When an OLED 200 is disposed on the thin-film transistor TFT, the via layer 170 generally planarizes a top surface of the thin-film transistor TFT, and protects the thin-film transistor TFT and various devices. The via layer 170 may include an acryl-based organic material or benzocyclobutene (BCB).

As illustrated in FIG. 2, the buffer layer 110, the first insulating layer 130, the second insulating layer 150, and the via layer 170 are disposed on the entire surface of the flexible substrate 100.

A pixel-defining layer 240 may be disposed above the thin-film transistor TFT. The pixel-defining layer 240 may be disposed on the via layer 170 and may have an opening for exposing a center portion of the pixel electrode 210. The pixel-defining layer 240 defines a pixel area on the flexible substrate 100.

The pixel-defining layer 240 may be formed as an organic insulating layer. The organic insulating layer may be formed of an acryl-based polymer such as polymethyl methacrylate (PMMA), polystyrene(PS), polymer derivatives including a phenol group, an imide-based polymer, an allyl ether-based polymer, an amide-based polymer, a fluorine-based polymer, a p-xylene-based polymer, a vinyl alcohol-based polymer, or a combination thereof.

The OLED 200 may be disposed on the pixel-defining layer 240. The OLED 200 may include the pixel electrode 210, an intermediate layer 220 including an emission layer (EML), and an opposite electrode 230.

The pixel electrode 210 may be formed as a transparent or translucent electrode or a reflective electrode. When the pixel electrode 210 is formed as the transparent or translucent electrode, the pixel electrode 210 may include ITO, IZO, ZnO, $In_2O_3$, IGO or AZO. When the pixel electrode 210 is formed as the reflective electrode, the pixel electrode 210 may have a reflective layer including Ag, Mg, Al, Pt, Pd, Au, Ni, Nd, Jr, Cr or a compound thereof and may have a layer including ITO, IZO, ZnO, $In_2O_3$, IGO or AZO. However, one or more exemplary embodiments are not limited thereto and thus the pixel electrode 210 may be formed of various materials and may have a single layer-structure or a multilayer-structure.

The intermediate layer 220 may be disposed in the pixel area defined by the pixel-defining layer 240. The intermediate layer 220 includes the EML that emits light in response to an electrical signal, and may have a structure in which a hole injection layer (HIL) and/or a hole transport layer (HTL) disposed between the EML and the pixel electrode 210, and an electron transport layer (ETL) and/or an electron injection layer (EIL) disposed between the EML and the opposite electrode 230, etc. are singularly or multiply stacked. In this regard, a structure of the intermediate layer 220 is not limited thereto and thus may vary.

The opposite electrode 230 that covers the intermediate layer 220 including the EML and faces the pixel electrode 210 may be disposed on the entire surface of the flexible substrate 100. The opposite electrode 230 may be formed as a transparent or translucent electrode or a reflective electrode.

When the opposite electrode 230 is formed as the transparent or translucent electrode, the opposite electrode 230 may have a layer including Li, Ca, LiF/Ca, LiF/Al, Al, Ag, Mg or a compound thereof having a small work function and a transparent or translucent conductive layer including ITO, IZO, ZnO or $In_2O_3$. When the opposite electrode 230 is formed as a reflective electrode, the opposite electrode 230 may have a layer including Li, Ca, LiF/Ca, LiF/Al, Al, Ag, Mg or a compound thereof. However, a structure and a material of the opposite electrode 230 are not limited thereto and may vary.

Referring to FIGS. 1 and 2, the opening 300a may be disposed on the peripheral area PA of the flexible substrate 100, and the first metal layer 300 may be disposed on the opening 300a. The first metal layer 300 may be disposed to cover inner sides of the opening 300a, and as illustrated in FIG. 1, the first metal layer 300 is formed in the opening 300a. Since the first metal layer 300 surrounds the display area DA as illustrated in FIG. 1, the opening 300a may also be disposed to surround the display area DA. That is, the opening 300a may also have a closed polygonal form or a closed curve form so as to surround the display area DA.

The opening 300a may penetrate through the first and second insulating layers 130 and 150 included in the thin-film transistor layer 180. A portion of the buffer layer 110 may be exposed via the opening 300a that penetrates through the first and second insulating layers 130 and 150. In this regard, as described above, the buffer layer 110 may include an inorganic insulating material.

As described above, the first and second insulating layers 130 and 150 may include an organic insulating material, and in this regard, when the first and second insulating layers 130 and 150 include the organic insulating material, flexibility of the flexible display 1 is improved. However, since the organic insulating material is vulnerable to penetration of external moisture, the flexible display 1 is also vulnerable to penetration of external oxygen and moisture. Moreover, since the first and second insulating layers 130 and 150 are disposed on the overall surface of the flexible substrate 100, side surfaces of the first and second insulating layers 130 and 150 are externally exposed at an outer side of the peripheral area PA, such that oxygen and moisture may flow into the display area DA via the externally exposed side surfaces of the first and second insulating layers 130 and 150.

Therefore, according to the present exemplary embodiment, the opening 300a that penetrates through the first and second insulating layers 130 and 150 is disposed on the peripheral area PA so as to surround the display area DA of the flexible substrate 100. The opening 300a may block a penetration path of oxygen and moisture that flow into the display area DA via the side surfaces of the first and second insulating layers 130 and 150.

The first metal layer 300 may be disposed on the opening 300a. In this regard, in order to dispose the first metal layer 300 on the opening 300a, a portion of the first metal layer 300 is filled in the opening 300a. That is, the opening 300a is filled with the first metal layer 300, and the first metal layer 300 may function as a barrier wall that blocks the penetration path of oxygen and moisture that flow into the display area DA via the side surfaces of the first and second insulating layers 130 and 150. As described above, the portion of the first metal layer 300 is filled in the opening 300a and thus the first metal layer 300 is disposed on the opening 300a, but the first metal layer 300 is not electrically connected to any device.

The first metal layer 300 may include the same material as the source electrode 160s and the drain electrode 160d of the thin-film transistor TFT. That is, during the manufacturing procedure, the first metal layer 300 and the source electrode 160s and the drain electrode 160d of the thin-film transistor TFT may be formed via the same process. Therefore, the first metal layer 300 may include a metal material, and for example, the first metal layer 300 may be formed as a single layer or a multistack layer including at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

The second metal layer 310 may be further disposed on the first metal layer 300. The second metal layer 310 may be formed to cover the first metal layer 300, and as the first metal layer 300, the second metal layer 310 may also surround the display area DA. The second metal layer 310 may include the same material as the pixel electrode 210. For example, the second metal layer 310 may be formed as a single layer or a multistack layer including at least one of silver (Ag), magnesium (Mg), aluminum (Al), platinum (Pt), palladium (Pd), gold (Au), nickel (Ni), neodymium (Nd), iridium (Ir), chrome (Cr), ITO, IZO, ZnO, $In_2O_3$, IGO, and AZO. The second metal layer 310 may be disposed on the first metal layer 300 and may prevent penetration of oxygen and moisture, which may flow on a top surface of the second insulating layer 150, into the first metal layer 300.

An insulating layer 340, which is formed as an extension of the pixel-defining layer 240, may be disposed on the second metal layer 310 in the peripheral area PA. When a thin-film encapsulation layer 400 is formed, the insulating layer 340 may function as a dam that prevents the thin-film encapsulation layer 400 from spreading toward an outer end of the flexible substrate 100. The insulating layer 340 may have a single layer-structure or a multilayer-structure, and a shape of the insulating layer 340 is not limited to that shown in FIG. 2 and may vary.

The thin-film encapsulation layer 400 may be disposed on the opposite electrode 230. Although not illustrated, the thin-film encapsulation layer 400 may have a multilayer-structure in which at least one inorganic layer and at least one organic layer are stacked. For example, the organic layer is formed of at least one of an acrylic resin, a methacrylic resin, polyisoprene, a vinyl-based resin, an epoxy-based resin, an urethane-based resin, a cellulose-based resin, and a perylene-based resin. The inorganic layer may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride (SiON).

The thin-film encapsulation layer 400 may be formed on the entire surface of the flexible substrate 100 while the thin-film encapsulation layer 400 covers the OLED 200, and may extend to the peripheral area PA of the flexible substrate 100. In the present exemplary embodiment, the thin-film encapsulation layer 400 extends on the first metal layer 300 so as to cover the first metal layer 300. By doing so, oxygen and moisture, which may flow on a top surface of the second insulating layer 150 disposed on the peripheral area PA of the flexible substrate 100, into the first metal layer 300 may be completely blocked.

According to the present exemplary embodiment, the flexible display 1 includes the opening 300a and the first metal layer 300 that is filled in the opening 300a and thus is disposed on the opening 300a, wherein the opening 300a is arranged in the display area DA and penetrates through the first and second insulating layers 130 and 150 so as to surround the display area DA of the flexible substrate 100, so that the penetration path of oxygen and moisture that flow into the display area DA via the side surfaces of the first and second insulating layers 130 and 150 may be blocked in the flexible display 1. Since the thin-film encapsulation layer 400 extends on the first metal layer 300 so as to cover the first metal layer 300, the thin-film encapsulation layer 400 may block penetration of oxygen and moisture that flow on the top surface of the second insulating layer 150 disposed on the peripheral area PA of the flexible substrate 100. Therefore, due to the aforementioned structure of the flexible display 1, oxygen and moisture that flow on top and side surfaces of the first and second insulating layers 130 and 150 formed as organic insulating layers may be completely blocked.

Figure 3:
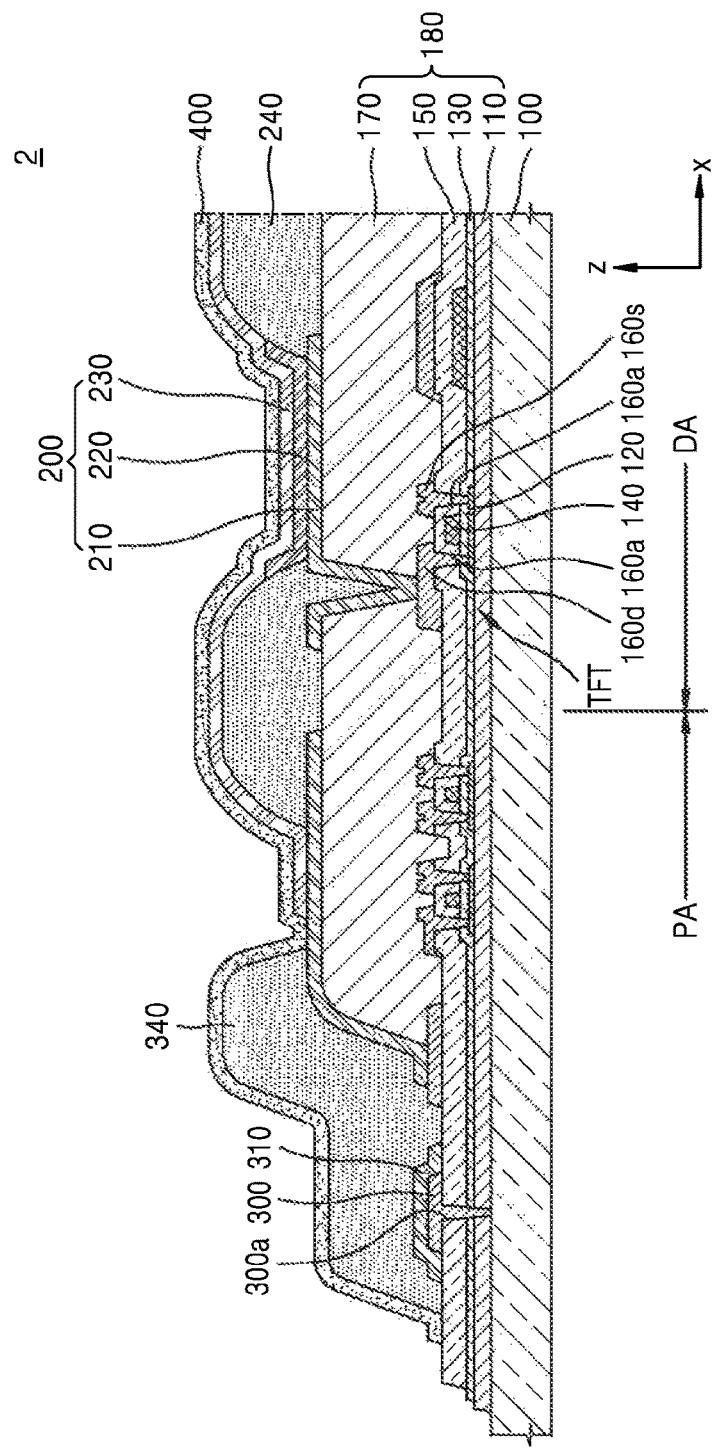
FIG. 3 illustrates a plan view of a flexible display, according to another exemplary embodiment.

FIG. 3 illustrates a plan view of a flexible display 2, according to another exemplary embodiment. The plan view of a flexible display 2 shown in FIG. 3 is equal to that of FIG. 1. With reference to FIG. 3, the thin-film transistor TFT and the OLED 200 of the flexible display 2 are the same as those of the flexible display 1, and thus, descriptions thereof provided above apply here.

Referring to FIGS. 1 and 3, the flexible display 2 according to the present exemplary embodiment includes the flexible substrate 100; the thin-film transistor layer 180 that is disposed on the flexible substrate 100 and includes the thin-film transistor TFT, and the buffer layer 110 and the first and second insulating layers 130 and 150 including an organic material; the pixel electrode 210; and the opening 300a, the first metal layer 300, and the second metal layer 310 that are disposed on a peripheral area PA of the flexible substrate 100.

The thin-film transistor layer 180 may be disposed on the flexible substrate 100. The thin-film transistor layer 180 may include the thin-film transistor TFT and a plurality of insulating layers. The pixel electrode 210 that is electrically connected to the thin-film transistor TFT may be disposed on the thin-film transistor layer 180. The thin-film transistor layer 180 may be an OLED display or a LCD. In the present exemplary embodiment, it is assumed that the thin-film transistor layer 180 is included in the OLED display.

The thin-film transistor TFT includes the semiconductor layer 120 including amorphous silicon, polycrystalline silicon, or an organic semiconductor material, the gate electrode 140, the source electrode 160s, and the drain electrode 160d.

First, the buffer layer 110 may be disposed on the flexible substrate 100 so as to planarize a top surface of the flexible substrate 100 or to prevent penetration of foreign substances into the semiconductor layer 120 of the thin-film transistor TFT, and the semiconductor layer 120 may be disposed on the buffer layer 110. In the flexible display 2 according to the present exemplary embodiment, in order to improve flexibility of the flexible display 2, the buffer layer 110 may be formed as a single layer or multistack layer including an organic insulating material such as an acryl-based organic material or benzocyclobutene (BCB).

The gate electrode 140 is disposed on the semiconductor layer 120, and in response to a signal applied to the gate electrode 140, the source electrode 160s and the drain electrode 160d are electrically connected.

In this regard, the first insulating layer 130 may be interposed between the semiconductor layer 120 and the gate electrode 140. The first insulating layer 130 may be a gate insulating layer arranged to assure insulation between the semiconductor layer 120 and the gate electrode 140, and may include an insulating material. For example, in order to improve flexibility of the flexible display 2, the first insulating layer 130 may be formed of an organic insulating material such as an acryl-based organic material or benzocyclobutene (BCB).

The second insulating layer 150 may be disposed on the gate electrode 140 and may function as an interlayer insulating layer that insulates the gate electrode 140 from the source electrode 160s and the drain electrode 160d. In order to improve flexibility of the flexible display 2, the second insulating layer 150 may be formed of an organic insulating material such as an acryl-based organic material or bnzocyclobutene (BCB).

The source electrode 160s and the drain electrode 160d are disposed on the second insulating layer 150. The source electrode 160s and the drain electrode 160d are electrically connected to the semiconductor layer 120 via the contact holes 160a that are formed in the second insulating layer 150 and the first insulating layer 130.

The via layer 170 may be disposed on the flexible substrate 100. In this regard, the via layer 170 may be a planarization layer or a protective layer. When the OLED 200 is disposed on the thin-film transistor TFT, the via layer 170 generally planarizes a top surface of the thin-film transistor TFT, and protects the thin-film transistor TFT and various devices. The via layer 170 may include an acryl-based organic material or benzocyclobutene (BCB).

As illustrated in FIG. 3, the buffer layer 110, the first insulating layer 130, the second insulating layer 150, and the via layer 170 are disposed on the entire surface of the flexible substrate 100.

The pixel-defining layer 240 may be disposed above the thin-film transistor TFT. The pixel-defining layer 240 may be disposed on the via layer 170 and may have an opening for exposing a center portion of the pixel electrode 210. The pixel-defining layer 240 defines a pixel area on the flexible substrate 100. The pixel-defining layer 240 may be formed as an organic insulating layer.

The OLED 200 may be disposed on the pixel-defining layer 240. The OLED 200 may include the pixel electrode 210, the intermediate layer 220 including an EML, and the opposite electrode 230.

Referring to FIG. 3, the opening 300a is disposed on the peripheral area PA of the flexible substrate 100, and the first metal layer 300 is disposed on the opening 300a. The first metal layer 300 may be disposed to cover inner sides of the opening 300a, and as illustrated in FIG. 3, the first metal layer 300 is formed in the opening 300a. Since the first metal layer 300 surrounds the display area DA as illustrated in FIG. 1, the opening 300a may also be disposed to surround the display area DA. That is, the opening 300a may also have a closed polygonal form or a closed curve form so as to surround the display area DA.

The opening 300a may penetrate through the buffer layer 110 and the first and second insulating layers 130 and 150 included in the thin-film transistor layer 180. A portion of the flexible substrate 100 may be exposed via the opening 300a that penetrates through the buffer layer 110 and the first and second insulating layers 130 and 150.

As described above, the buffer layer 110 and the first and second insulating layers 130 and 150 may include an organic insulating material, and in this regard, when the buffer layer 110 and the first and second insulating layers 130 and 150 include the organic insulating material, flexibility of the flexible display 2 is improved. However, since the organic insulating material is vulnerable to penetration of external moisture, the flexible display 2 is also vulnerable to penetration of external oxygen and moisture. Moreover, since the buffer layer 110 and the first and second insulating layers 130 and 150 are disposed on the overall surface of the flexible substrate 100, side surfaces of the buffer layer 110 and the first and second insulating layers 130 and 150 are externally exposed at an outer side of the peripheral area PA, such that oxygen and moisture may flow into the display area DA via the externally exposed side surfaces of the buffer layer 110 and the first and second insulating layers 130 and 150.

Therefore, according to the present exemplary embodiment, the opening 300a that penetrates through the buffer layer 110 and the first and second insulating layers 130 and 150 is disposed on the peripheral area PA so as to surround the display area DA of the flexible substrate 100. The opening 300a may block a penetration path of oxygen and moisture that flow into the display area DA via the side surfaces of the buffer layer 110 and the first and second insulating layers 130 and 150.

The first metal layer 300 may be disposed on the opening 300a. In this regard, in order to dispose the first metal layer 300 on the opening 300a, a portion of the first metal layer 300 is filled in the opening 300a. That is, the opening 300a is filled with the first metal layer 300, and the first metal layer 300 may function as a barrier wall that blocks the penetration path of oxygen and moisture that flow into the display area DA via the side surfaces of the buffer layer 110 and the first and second insulating layers 130 and 150. As described above, the portion of the first metal layer 300 is filled in the opening 300a and thus the first metal layer 300 is disposed on the opening 300a, but the first metal layer 300 is not electrically connected to any device.

The first metal layer 300 may be formed of the same material as the source electrode 160s and the drain electrode 160d of the thin-film transistor TFT. That is, during the manufacturing procedure, the first metal layer 300 and the source electrode 160s and the drain electrode 160d of the thin-film transistor TFT may be formed via the same process. Therefore, the first metal layer 300 may include a metal material, and for example, the first metal layer 300 may be formed as a single layer or a multistack layer including at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

The second metal layer 310 may be further disposed on the first metal layer 300. The second metal layer 310 may be formed to cover the first metal layer 300, and as the first metal layer 300, the second metal layer 310 may also surround the display area DA. The second metal layer 310 may include the same material as the pixel electrode 210. For example, the second metal layer 310 may be formed as a single layer or a multistack layer including at least one of silver (Ag), magnesium (Mg), aluminum (Al), platinum (Pt), palladium (Pd), gold (Au), nickel (Ni), neodymium (Nd), iridium (Ir), chrome (Cr), ITO, IZO, ZnO, In$_2$O$_3$, IGO, and AZO. The second metal layer 310 may be disposed on the first metal layer 300, and may prevent penetration of oxygen and moisture, which may flow on a top surface of the second insulating layer 150, into the first metal layer 300.

The insulating layer 340, which is formed as an extension of the pixel-defining layer 240, may be disposed on the second metal layer 310 in the peripheral area PA. When a thin-film encapsulation layer 400 is formed, the insulating layer 340 may function as a dam that prevents the thin-film encapsulation layer 400 from spreading toward an outer end of the flexible substrate 100. The insulating layer 340 may have a single layer-structure or a multilayer-structure, and a shape of the insulating layer 340 is not limited to that shown in FIG. 3 and may vary.

The thin-film encapsulation layer 400 may be disposed on the opposite electrode 230. Although not illustrated, the thin-film encapsulation layer 400 may have a multilayer-structure in which at least one inorganic layer and at least one organic layer are stacked. The thin-film encapsulation layer 400 may be formed on the entire surface of the flexible substrate 100 while the thin-film encapsulation layer 400 covers the OLED 200, and may extend to the peripheral area PA of the flexible substrate 100. In the present exemplary embodiment, the thin-film encapsulation layer 400 extends on the first metal layer 300 so as to cover the first metal layer 300. By doing so, oxygen and moisture, which may flow on a top surface of the second insulating layer 150 disposed on the peripheral area PA of the flexible substrate 100, into the first metal layer 300 may be completely blocked.

According to the present exemplary embodiment, the flexible display 2 includes the opening 300a and the first metal layer 300 that is filled in the opening 300a and thus is disposed on the opening 300a, wherein the opening 300a is arranged in the display area DA and penetrates through the buffer layer 110 and the first and second insulating layers 130 and 150 so as to surround the display area DA of the flexible substrate 100, so that the penetration path of oxygen and moisture that flow into the display area DA via the side surfaces of the buffer layer 110 and the first and second insulating layers 130 and 150 may be blocked in the flexible display 2. Since the thin-film encapsulation layer 400 extends on the first metal layer 300 so as to cover the first metal layer 300, the thin-film encapsulation layer 400 may block penetration of oxygen and moisture that flow on the top surface of the second insulating layer 150 disposed on the peripheral area PA of the flexible substrate 100. Therefore, due to the aforementioned structure of the flexible display 2, oxygen and moisture that flow on top and side surfaces of the first and second insulating layers 130 and 150 formed as organic insulating layers may be completely blocked.

Figure 4:
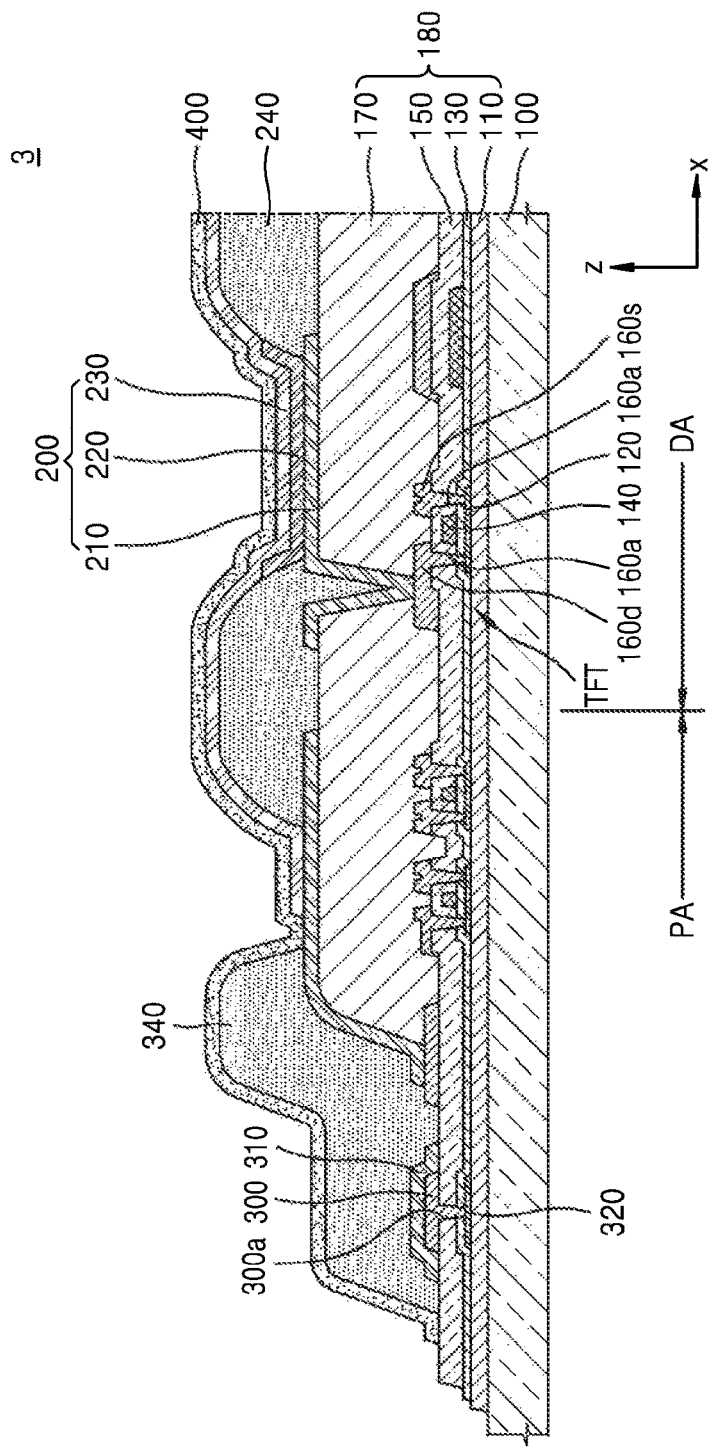
FIG. 4 illustrates a plan view of a flexible display, according to another exemplary embodiment.

FIG. 4 illustrates a plan view of a flexible display 3, according to another exemplary embodiment. The plan view of a flexible display 3 shown in FIG. 4 is equal to that of FIG. 1. With reference to FIG. 4, the thin-film transistor TFT and the OLED 200 of the flexible display 3 are the same as those of the flexible display 1, and thus, descriptions thereof provided above apply here.

Referring to FIGS. 1 and 4, the flexible display 3 according to the present exemplary embodiment includes the flexible substrate 100; the thin-film transistor layer 180 that is disposed on the flexible substrate 100 and includes the thin-film transistor TFT, and the first and second insulating layers 130 and 150 including an organic material; the pixel electrode 210; the opening 300a, the first metal layer 300, and the second metal layer 310 that are disposed on a peripheral area PA of the flexible substrate 100; and a first material layer 320 whose top surface is partially exposed due to the opening 300a.

The thin-film transistor layer 180 may be disposed on the flexible substrate 100. The thin-film transistor layer 180 may include the thin-film transistor TFT and a plurality of insulating layers. The pixel electrode 210 that is electrically connected to the thin-film transistor TFT may be disposed on the thin-film transistor layer 180. The thin-film transistor layer 180 may be an OLED display or a LCD. In the present exemplary embodiment, it is assumed that the thin-film transistor layer 180 is included in the OLED display.

The thin-film transistor TFT includes the semiconductor layer 120 including amorphous silicon, polycrystalline silicon, or an organic semiconductor material, the gate electrode 140, the source electrode 160s, and the drain electrode 160d. For insulation purposes, the first and second insulating layers 130 and 150 may be disposed between the semiconductor layer 120 and the gate electrode 140, the source electrode 160s, and the drain electrode 160d.

First, the buffer layer 110 may be disposed on the flexible substrate 100 so as to planarize a top surface of the flexible substrate 100 or to prevent penetration of foreign substances into the semiconductor layer 120 of the thin-film transistor TFT, and the semiconductor layer 120 may be disposed on the buffer layer 110. The buffer layer 110 may include an inorganic insulating material such as silicon oxide or silicon nitride and may be formed as a single layer or multistack layer.

The gate electrode 140 is disposed on the semiconductor layer 120, and in response to a signal applied to the gate electrode 140, the source electrode 160s and the drain electrode 160d are electrically connected.

In this regard, the first insulating layer 130 may be interposed between the semiconductor layer 120 and the gate electrode 140. The first insulating layer 130 may be a gate insulating layer arranged to assure insulation between the semiconductor layer 120 and the gate electrode 140, and may include an insulating material. For example, in order to improve flexibility of the flexible display 3, the first insulating layer 130 may be formed of an organic insulating material such as an acryl-based organic material or benzocyclobutene (BCB).

The second insulating layer 150 may be disposed on the gate electrode 140 and may function as an interlayer insulating layer that insulates the gate electrode 140 from the source electrode 160s and the drain electrode 160d. In order to improve flexibility of the flexible display 3, the second insulating layer 150 may include an organic insulating material such as an acryl-based organic material or bnzocyclobutene (BCB).

The source electrode 160s and the drain electrode 160d are disposed on the second insulating layer 150. The source electrode 160s and the drain electrode 160d are electrically connected to the semiconductor layer 120 via the contact holes 160a that are formed in the second insulating layer 150 and the first insulating layer 130.

The via layer 170 may be disposed on the flexible substrate 100. In this regard, the via layer 170 may be a planarization layer or a protective layer. When the OLED 200 is disposed on the thin-film transistor TFT, the via layer 170 generally planarizes a top surface of the thin-film transistor TFT, and protects the thin-film transistor TFT and various devices. The via layer 170 may include an acryl-based organic material or benzocyclobutene (BCB).

As illustrated in FIG. 4, the buffer layer 110, the first insulating layer 130, the second insulating layer 150, and the via layer 170 may be disposed on the entire surface of the flexible substrate 100.

The pixel-defining layer 240 may be disposed above the thin-film transistor TFT. The pixel-defining layer 240 may be disposed on the via layer 170 and may have an opening for exposing a center portion of the pixel electrode 210. The pixel-defining layer 240 defines a pixel area on the flexible substrate 100. The pixel-defining layer 240 may be formed as an organic insulating layer.

The OLED 200 may be disposed on the pixel-defining layer 240. The OLED 200 may include the pixel electrode 210, the intermediate layer 220 including an EML, and the opposite electrode 230.

Referring to FIG. 4, the opening 300a is disposed on the peripheral area PA of the flexible substrate 100, and the first metal layer 300 may be disposed on the opening 300a. The first metal layer 300 may cover inner sides of the opening 300a, and as illustrated in FIG. 4, the first metal layer 300 is formed in the opening 300a. Since the first metal layer 300 surrounds the display area DA as illustrated in FIG. 1, the opening 300a may also be disposed to surround the display area DA. That is, the opening 300a may also have a closed polygonal form or a closed curve form so as to surround the display area DA.

The first material layer 320 may be disposed on a portion of the buffer layer 110 where the opening 300a is disposed. The first material layer 320 may also surround the display area DA along disposition of the opening 300a. The first material layer 320 may include the same material as a semiconductor layer of the thin-film transistor TFT.

The opening 300a may penetrate through the first and second insulating layers 130 and 150 including an organic insulating material. A portion of the first material layer 320 may be exposed via the opening 300a that penetrates through the first and second insulating layers 130 and 150.

As described above, the first and second insulating layers 130 and 150 may include an organic insulating material, and in this regard, when the first and second insulating layers 130 and 150 include the organic insulating material, flexibility of the flexible display 3 is improved. However, since the organic insulating material is vulnerable to penetration of external moisture, the flexible display 3 is also vulnerable to penetration of external oxygen and moisture. Moreover, since the first and second insulating layers 130 and 150 are disposed on the overall surface of the flexible substrate 100, side surfaces of the first and second insulating layers 130 and 150 are externally exposed at an outer side of the peripheral area PA, such that oxygen and moisture may flow into the display area DA via the externally exposed side surfaces of the first and second insulating layers 130 and 150.

Therefore, according to the present exemplary embodiment, the opening 300a that penetrates through the first and second insulating layers 130 and 150 is disposed on the peripheral area PA so as to surround the display area DA of the flexible substrate 100. The opening 300a may block a penetration path of oxygen and moisture that flow into the display area DA via the side surfaces of the first and second insulating layers 130 and 150.

The first metal layer 300 may be disposed on the opening 300a. In this regard, in order to dispose the first metal layer 300 on the opening 300a, a portion of the first metal layer 300 is filled in the opening 300a. That is, the opening 300a is filled with the first metal layer 300, and the first metal layer 300 may function as a barrier wall that blocks the penetration path of oxygen and moisture that flow into the display area DA via the side surfaces of the first and second insulating layers 130 and 150.

As described above, the portion of the first metal layer 300 is filled in the opening 300a and thus the first metal layer 300 is disposed on the opening 300a, but the first metal layer 300 is not electrically connected to any device. Although the first metal layer 300 contacts the first material layer 320 via the opening 300a, it does not electrically connect the first metal layer 300 and the first material layer 320. Here, the first material layer 320 further forms a protrusion around the display area DA, and the first metal layer 300 contacts, via the opening 300a, the first material layer 320 that forms the protrusion, so that moisture penetration through the side surfaces of the first and second insulating layers 130 and 150 may be effectively prevented.

The first metal layer 300 may include the same material as the source electrode 160s and the drain electrode 160d of the thin-film transistor TFT. That is, during the manufacturing procedure, the first metal layer 300 and the source electrode 160s and the drain electrode 160d of the thin-film transistor TFT may be formed via the same process.

The second metal layer 310 may be further disposed on the first metal layer 300. The second metal layer 310 may be formed to cover the first metal layer 300, and as the first metal layer 300, the second metal layer 310 may also surround the display area DA. The second metal layer 310 may be formed of the same material as the pixel electrode 210 and may be formed as a single layer or a multistack layer. The second metal layer 310 may be disposed on the first metal layer 300, and may prevent penetration of oxygen and moisture, which may flow on a top surface of the second insulating layer 150, into the first metal layer 300.

The insulating layer 340, which is formed as an extension of the pixel-defining layer 240, may be disposed on the second metal layer 310 in the peripheral area PA. When a thin-film encapsulation layer 400 is formed, the insulating layer 340 may function as a dam that prevents the thin-film encapsulation layer 400 from spreading toward an outer end of the flexible substrate 100. The insulating layer 340 may have a single layer-structure or a multilayer-structure, and a shape of the insulating layer 340 is not limited to that shown in FIG. 4 and may vary.

The thin-film encapsulation layer 400 may be disposed on the opposite electrode 230. Although not illustrated, the thin-film encapsulation layer 400 may have a multilayer-structure in which at least one inorganic layer and at least one organic layer are stacked. The thin-film encapsulation layer 400 may be formed on the entire surface of the flexible substrate 100 while the thin-film encapsulation layer 400 covers the OLED 200, and may extend to the peripheral area PA of the flexible substrate 100. In the present exemplary embodiment, the thin-film encapsulation layer 400 extends on the first metal layer 300 so as to cover the first metal layer 300. By doing so, oxygen and moisture, which may flow on a top surface of the second insulating layer 150 disposed on the peripheral area PA of the flexible substrate 100, into the first metal layer 300 may be completely blocked.

According to the present exemplary embodiment, the flexible display 3 includes the opening 300a and the first metal layer 300 that is filled in the opening 300a and thus is disposed on the opening 300a, wherein the opening 300a is arranged in the display area DA and penetrates through the first and second insulating layers 130 and 150 so as to surround the display area DA of the flexible substrate 100, so that the penetration path of oxygen and moisture that flow into the display area DA via the side surfaces of the first and second insulating layers 130 and 150 may be blocked in the flexible display 3. Since the thin-film encapsulation layer 400 extends on the first metal layer 300 so as to cover the first metal layer 300, the thin-film encapsulation layer 400 may block penetration of oxygen and moisture that flow on top surfaces of the first and second insulating layers 130 and 150 disposed on the peripheral area PA of the flexible substrate 100. Therefore, due to the aforementioned structure of the flexible display 3, oxygen and moisture that flow on top and side surfaces of the first and second insulating layers 130 and 150 formed as organic insulating layers may be completely blocked.

Figure 5:
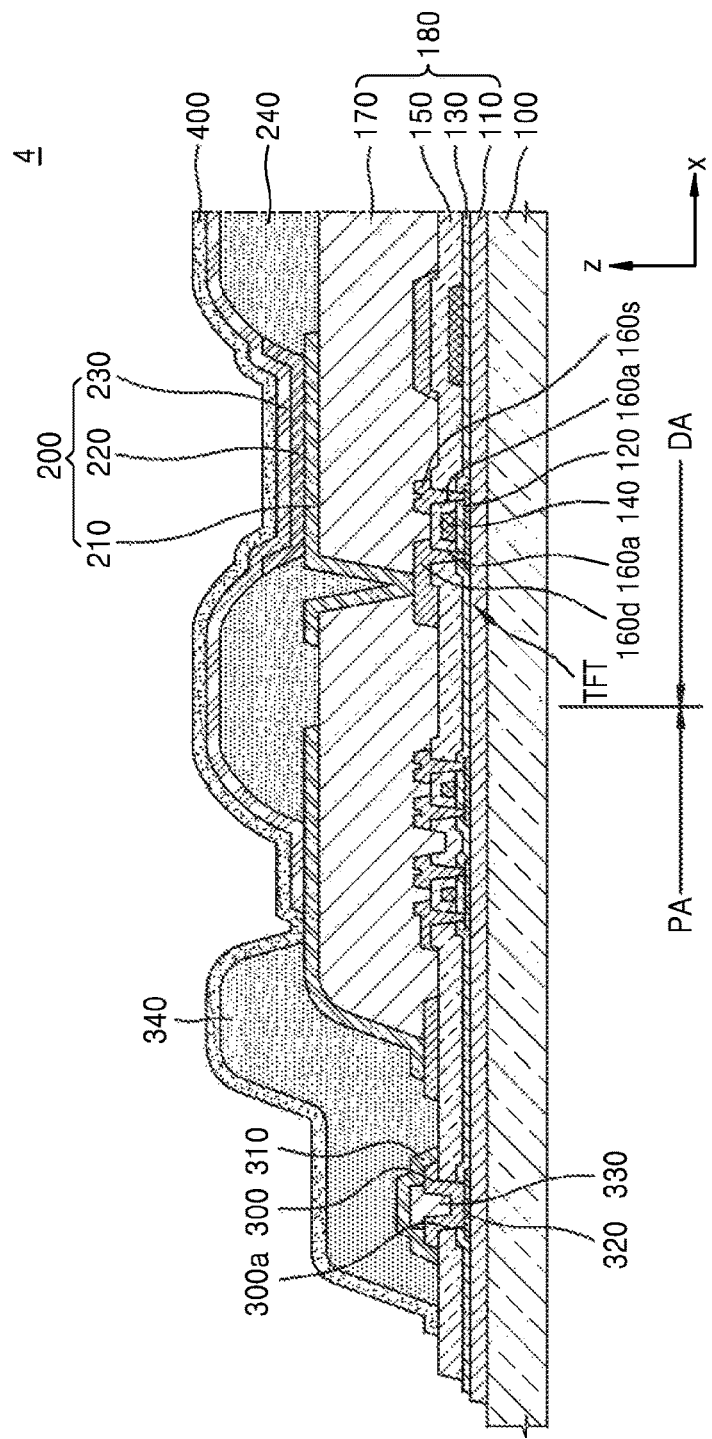
FIG. 5 illustrates a plan view of a flexible display, according to another exemplary embodiment.

FIG. 5 illustrates a plan view of a flexible display 4, according to another exemplary embodiment. The plan view of a flexible display 4 shown in FIG. 5 is equal to that of FIG. 1. With reference to FIG. 5, the thin-film transistor TFT and the OLED 200 of the flexible display 4 are the same as those of the flexible display 1, and thus, descriptions thereof provided above apply here.

Referring to FIGS. 1 and 5, the flexible display 4 according to the present exemplary embodiment includes the flexible substrate 100; the thin-film transistor layer 180 that is disposed on the flexible substrate 100 and includes the thin-film transistor TFT, and the first and second insulating layers 130 and 150 including an organic material; the pixel electrode 210; the opening 300a, the first metal layer 300, and the second metal layer 310 that are disposed on a peripheral area PA of the flexible substrate 100; the first material layer 320; and a second material layer 330 interposed between the first metal layer 300 and the second metal layer 310.

The thin-film transistor layer 180 may be disposed on the flexible substrate 100. The thin-film transistor layer 180 may include the thin-film transistor TFT and a plurality of insulating layers. The pixel electrode 210 that is electrically connected to the thin-film transistor TFT may be disposed on the thin-film transistor layer 180. The thin-film transistor layer 180 may be an OLED display or a LCD. In the present exemplary embodiment, it is assumed that the thin-film transistor layer 180 is included in the OLED display.

The thin-film transistor TFT includes the semiconductor layer 120 including amorphous silicon, polycrystalline silicon, or an organic semiconductor material, the gate electrode 140, the source electrode 160s, and the drain electrode 160d. For insulation, the first and second insulating layers 130 and 150 may be disposed between the semiconductor layer 120 and the gate electrode 140, the source electrode 160s, and the drain electrode 160d.

First, the buffer layer 110 may be disposed on the flexible substrate 100 so as to planarize a top surface of the flexible substrate 100 or to prevent penetration of foreign substances into the semiconductor layer 120 of the thin-film transistor TFT, and the semiconductor layer 120 may be disposed on the buffer layer 110. The buffer layer 110 may include an inorganic insulating material such as silicon oxide or silicon nitride and may be formed as a single layer or multistack layer.

The gate electrode 140 is disposed on the semiconductor layer 120, and in response to a signal applied to the gate electrode 140, the source electrode 160s and the drain electrode 160d are electrically connected.

In this regard, the first insulating layer 130 may be interposed between the semiconductor layer 120 and the gate electrode 140. The first insulating layer 130 may be a gate insulating layer arranged to assure insulation between the semiconductor layer 120 and the gate electrode 140, and may include an insulating material. For example, in order to improve flexibility of the flexible display 3, the first insulating layer 130 may be formed of an organic insulating material such as an acryl-based organic material or benzocyclobutene (BCB).

The second insulating layer 150 may be disposed on the gate electrode 140 and may function as an interlayer insulating layer that insulates the gate electrode 140 from the source electrode 160s and the drain electrode 160d. In order to improve flexibility of the flexible display 4, the second insulating layer 150 may be formed of an organic insulating material such as an acryl-based organic material or bnzocyclobutene (BCB).

The source electrode 160s and the drain electrode 160d are disposed on the second insulating layer 150. The source electrode 160s and the drain electrode 160d are electrically connected to the semiconductor layer 120 via the contact holes 160a that are formed in the second insulating layer 150 and the first insulating layer 130.

The via layer 170 may be disposed on the flexible substrate 100. In this regard, the via layer 170 may be a planarization layer or a protective layer. When the OLED 200 is disposed on the thin-film transistor TFT, the via layer 170 generally planarizes a top surface of the thin-film transistor TFT, and protects the thin-film transistor TFT and various devices. The via layer 170 may include an acryl-based organic material or benzocyclobutene (BCB).

As illustrated in FIG. 5, the buffer layer 110, the first insulating layer 130, the second insulating layer 150, and the via layer 170 may be disposed on the entire surface of the flexible substrate 100.

The pixel-defining layer 240 may be disposed above the thin-film transistor TFT. The pixel-defining layer 240 may be disposed on the via layer 170 and may have an opening for exposing a center portion of the pixel electrode 210. The pixel-defining layer 240 defines a pixel area on the flexible substrate 100. The pixel-defining layer 240 may be formed as an organic insulating layer.

The OLED 200 may be disposed on the pixel-defining layer 240. The OLED 200 may include the pixel electrode 210, the intermediate layer 220 including an EML, and the opposite electrode 230.

Referring to FIG. 5, the opening 300*a* is disposed on the peripheral area PA of the flexible substrate 100, and the first metal layer 300 may be disposed on the opening 300*a*. The first metal layer 300 may be disposed to cover inner sides of the opening 300*a*. Since the first metal layer 300 surrounds the display area DA as illustrated in FIG. 1, the opening 300*a* may also be disposed to surround the display area DA. That is, the opening 300*a* may also have a closed polygonal form or a closed curve form so as to surround the display area DA.

The first material layer 320 may be disposed on a portion of the buffer layer 110 where the opening 300*a* is disposed. The first material layer 320 may also surround the display area DA along disposition of the opening 300*a*. The first material layer 320 may include the same material as a semiconductor layer of the thin-film transistor TFT.

The opening 300*a* may penetrate through the first and second insulating layers 130 and 150 including an organic insulating material. A portion of the first material layer 320 may be exposed via the opening 300*a* that penetrates through the first and second insulating layers 130 and 150.

As described above, the first and second insulating layers 130 and 150 may include an organic insulating material, and in this regard, when the first and second insulating layers 130 and 150 include the organic insulating material, flexibility of the flexible display 4 is improved. However, since the organic insulating material is vulnerable to penetration of external moisture, the flexible display 4 is also vulnerable to penetration of external oxygen and moisture. Moreover, since the first and second insulating layers 130 and 150 are disposed on the overall surface of the flexible substrate 100, side surfaces of the first and second insulating layers 130 and 150 are externally exposed at an outer side of the peripheral area PA, such that oxygen and moisture may flow into the display area DA via the externally exposed side surfaces of the first and second insulating layers 130 and 150.

Therefore, according to the present exemplary embodiment, the opening 300*a* that penetrates through the first and second insulating layers 130 and 150 is disposed on the peripheral area PA so as to surround the display area DA of the flexible substrate 100. The opening 300*a* may block a penetration path of oxygen and moisture that flow into the display area DA via the side surfaces of the first and second insulating layers 130 and 150.

The first metal layer 300 may be disposed on the opening 300*a*, and in this regard, when the first metal layer 300 is disposed on the opening 300*a*, the first metal layer 300 may cover inner sides of the opening 300*a*. That is, in the flexible display 4 according to the present exemplary embodiment, the opening 300*a* has a preset width, the first metal layer 300 is disposed on the opening 300*a* so as to cover the inner sides of the opening 300*a*, and the first metal layer 300 may function as a barrier wall that blocks the penetration path of oxygen and moisture that flow into the display area DA via the side surfaces of the first and second insulating layers 130 and 150.

As described above, the portion of the first metal layer 300 is disposed along the inner sides of the opening 300*a*, but the first metal layer 300 is not electrically connected to any device. Although the first metal layer 300 contacts the first material layer 320 via the opening 300*a*, it does not electrically connect the first metal layer 300 and the first material layer 320. Here, the first material layer 320 further forms a protrusion around the display area DA, and the first metal layer 300 contacts, via the opening 300*a*, the first material layer 320 that forms the protrusion, so that moisture penetration through the side surfaces of the first and second insulating layers 130 and 150 may be effectively prevented.

The first metal layer 300 may include the same material as the source electrode 160*s* and the drain electrode 160*d* of the thin-film transistor TFT. That is, during the manufacturing procedure, the first metal layer 300 and the source electrode 160*s* and the drain electrode 160*d* of the thin-film transistor TFT may be formed via the same process.

In the flexible display 4 according to the present exemplary embodiment, the second material layer 330 may be disposed on the first metal layer 300. The second material layer 330 may be formed by filing to partly cover the first metal layer 300 that is disposed along the inner sides of the opening 300*a*. The second material layer 330 may be formed from same material as the via layer 170, and according to a material of the via layer 170, the second material layer 330 may include an organic material or an inorganic material. In this regard, the second material layer 330 may be disposed only on the first metal layer 300 and does not extend an area where the first metal layer 300 is disposed.

The second metal layer 310 may be further disposed on the second material layer 330. The second metal layer 310 may be disposed to cover the first metal layer 300 and the second material layer 330, and as the first metal layer 300, the second metal layer 310 may also surround the display area DA. The second metal layer 310 may include the same material as the pixel electrode 210 and may be formed as a single layer or multistack layer. The second metal layer 310 may be formed to cover the first metal layer 300, so that the second metal layer 310 may prevent penetration of oxygen and moisture, which may flow on a top surface of the second insulating layer 150, into the first metal layer 300.

The insulating layer 340, which is formed as an extension of the pixel-defining layer 240, may be disposed on the second metal layer 310 in the peripheral area PA. When a thin-film encapsulation layer 400 is formed, the insulating layer 340 may function as a dam that prevents the thin-film encapsulation layer 400 from spreading toward an outer end of the flexible substrate 100. The insulating layer 340 may have a single layer-structure or a multilayer-structure, and a shape of the insulating layer 340 is not limited to that shown in FIG. 5 and may vary.

The thin-film encapsulation layer 400 may be disposed on the opposite electrode 230. Although not illustrated, the thin-film encapsulation layer 400 may have a multilayer-structure in which at least one inorganic layer and at least one organic layer are stacked. The thin-film encapsulation layer 400 may be formed on the entire surface of the flexible substrate 100 while the thin-film encapsulation layer 400 covers the OLED 200, and may extend to the peripheral area PA of the flexible substrate 100. In the present exemplary embodiment, the thin-film encapsulation layer 400 extends on the first metal layer 300 so as to cover the first metal layer 300. By doing so, oxygen and moisture, which may flow on a top surface of the second insulating layer 150 disposed on the peripheral area PA of the flexible substrate 100, into the first metal layer 300 may be completely blocked.

According to the present exemplary embodiment, the flexible display 4 includes the opening 300*a* and the first metal layer 300 that is filled in the opening 300*a* and thus is disposed on the opening 300*a*, wherein the opening 300*a* is arranged in the display area DA and penetrates through the first and second insulating layers 130 and 150 so as to surround the display area DA of the flexible substrate 100, so that the penetration path of oxygen and moisture that flow into the display area DA via the side surfaces of the first and second insulating layers 130 and 150 may be blocked in the flexible display 4. Since the thin-film encapsulation layer 400 extends on the first metal layer 300 so as to cover the first metal layer 300, the thin-film encapsulation layer 400 may block penetration of oxygen and moisture that flow on a top surface of the second insulating layer 150 disposed on the peripheral area PA of the flexible substrate 100. Therefore, due to the aforementioned structure of the flexible display 4, oxygen and moisture that flow on top and side surfaces of the first and second insulating layers 130 and 150 formed as organic insulating layers may be completely blocked.

The flexible display have been described in the above, but one or more exemplary embodiments are not limited thereto. For example, a flexible display method performed to manufacture one of the flexible display may also belong to the scope of the one or more exemplary embodiments.

Figure 6:
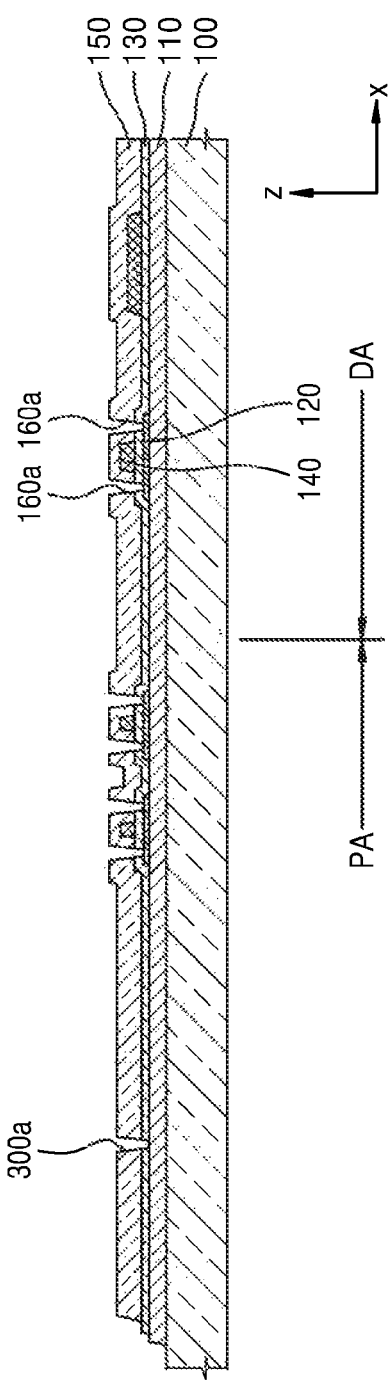
FIGS. 6, 7 and 8 are cross-sectional views illustrating a manufacturing procedure with respect to the flexible display, according to an exemplary embodiment.
Figure 7:
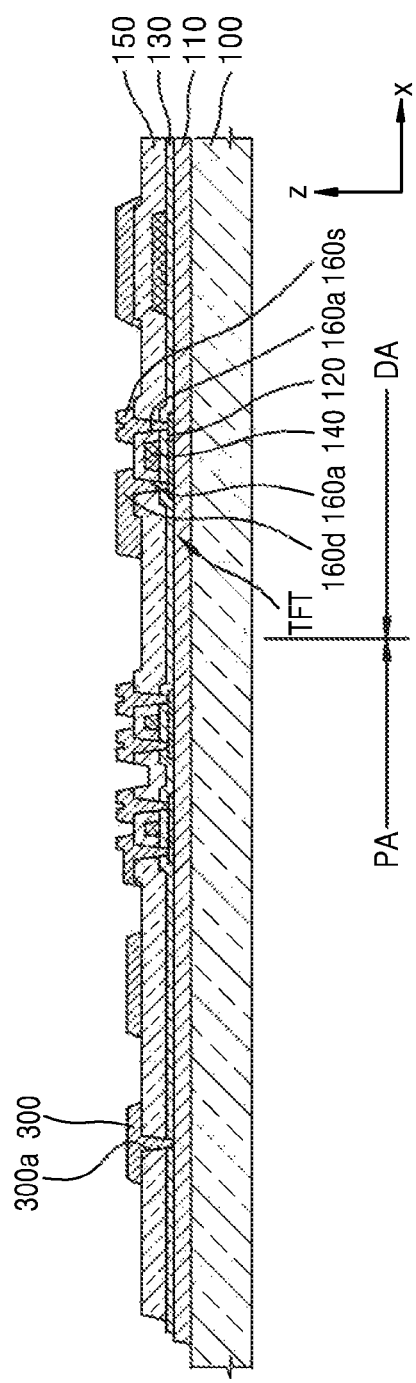
Figure 8:
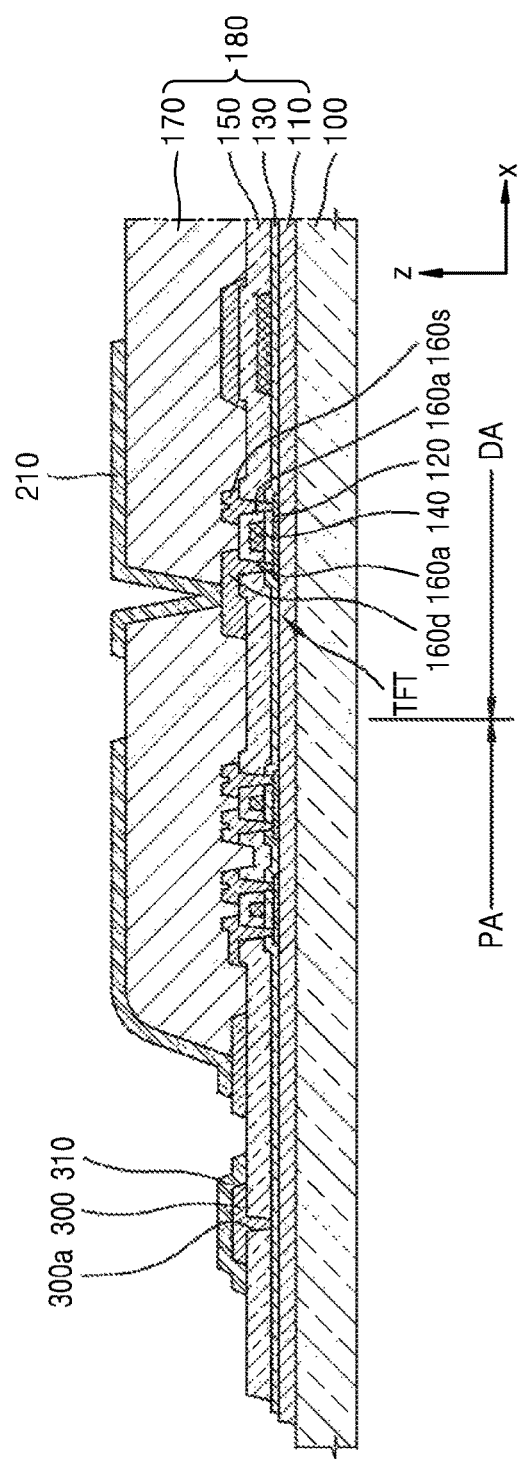

FIGS. 6 through 8 are cross-sectional views illustrating a manufacturing procedure with respect to the flexible display 1, according to an exemplary embodiment.

Referring to FIG. 6, the flexible substrate 100 that has the display area DA and the peripheral area PA that surrounds the display area DA is prepared.

The flexible substrate 100 may include various materials having a flexible characteristic. The buffer layer 110 may be disposed on the flexible substrate 100 so as to planarize a top surface of the flexible substrate 100 or to prevent penetration of foreign substances into the semiconductor layer 120 of the thin-film transistor TFT. The buffer layer 110 may be formed as a single layer or multistack layer including silicon oxide or silicon nitride.

The semiconductor layer 120 that forms the thin-film transistor TFT may be formed on the display area DA of the flexible substrate 100. After the semiconductor layer 120 is formed, the first insulating layer 130 may be formed on the semiconductor layer 120. The first insulating layer 130 may electrically insulate the semiconductor layer 120 from the gate electrode 140. The first insulating layer 130 may be formed on the entire surface of the flexible substrate 100 and may include an organic insulating material.

The gate electrode 140 that partly overlaps the semiconductor layer 120 may be formed on the semiconductor layer 120. After the gate electrode 140 is formed, the second insulating layer 150 may be formed on the gate electrode 140. As the first insulating layer 130, the second insulating layer 150 may be formed on the entire surface of the flexible substrate 100 and may include an organic insulating material.

Afterward, the contact holes 160a that penetrate through the first and second insulating layers 130 and 150 so as to expose a portion of the semiconductor layer 120 may be formed. At the same time, the opening 300a that penetrates through the first and second insulating layers 130 and 150 may be formed in the peripheral area PA of the flexible substrate 100. Through the opening 300a, a portion of the buffer layer 110 may be externally exposed.

As described above, the first and second insulating layers 130 and 150 may be formed of an organic insulating material, and when the first and second insulating layers 130 and 150 are formed of the organic insulating material, flexibility of the flexible display 1 is improved. However, since the organic insulating material is vulnerable to penetration of external moisture, the flexible display 1 is also vulnerable to penetration of external oxygen and moisture. Moreover, since the first and second insulating layers 130 and 150 are disposed on the overall surface of the flexible substrate 100, side surfaces of the first and second insulating layers 130 and 150 are externally exposed at an outer side of the peripheral area PA, such that oxygen and moisture may flow into the display area DA via the externally exposed side surfaces of the first and second insulating layers 130 and 150.

Therefore, according to the present exemplary embodiment, the opening 300a that penetrates through the first and second insulating layers 130 and 150 is disposed on the peripheral area PA so as to surround the display area DA of the flexible substrate 100. The opening 300a may block a penetration path of oxygen and moisture that flow into the display area DA via the side surfaces of the first and second insulating layers 130 and 150.

Referring to FIG. 7, the source electrode 160s and the drain electrode 160d of the thin-film transistor TFT may be formed. The source electrode 160s and the drain electrode 160d may be electrically connected to the semiconductor layer 120 via the contact holes 160a.

As described above, when the source electrode 160s and the drain electrode 160d are formed, the first metal layer 300 may be simultaneously formed in the opening 300a of the peripheral area PA. Therefore, the first metal layer 300 may include the same material as the source electrode 160s and the drain electrode 160d. When the first metal layer 300 is disposed on the opening 300a, the first metal layer 300 is formed so that a portion of the first metal layer 300 is formed in the opening 300a. That is, the first metal layer 300 is formed in the opening 300a, and the first metal layer 300 that is formed in the opening 300a surrounds the display area DA and thus may function as a barrier wall that blocks a penetration path of oxygen and moisture that flow into the display area DA via side surfaces of the first and second insulating layers 130 and 150. As described above, the portion of the first metal layer 300 is formed in the opening 300a and thus the first metal layer 300 is disposed on the opening 300a, but the first metal layer 300 is not electrically connected to any device.

Afterward, referring to FIG. 8, the via layer 170 may be formed on the thin-film transistor TFT, and the pixel electrode 210 that is electrically connected to the thin-film transistor layer 180 may be formed on the via layer 170.

When the pixel electrode 210 is formed, the second metal layer 310 may be simultaneously formed on the first metal layer 300 of the peripheral area PA. As the first metal layer 300, the second metal layer 310 may surround the display area DA. The second metal layer 310 may be formed to include the same material as the pixel electrode 210. The second metal layer 310 may be disposed on the first metal layer 300, and may prevent penetration of oxygen and moisture, which may flow on a top surface of the second insulating layer 150, into the first metal layer 300.

The insulating layer 340, which is formed as an extension of the pixel-defining layer 240, may be disposed on the second metal layer 310 in the peripheral area PA. When the thin-film encapsulation layer 400 is formed, the insulating layer 340 may function as a dam that prevents the thin-film encapsulation layer 400 from spreading toward an outer end of the flexible substrate 100. The insulating layer 340 may have a single layer-structure or a multilayer-structure, and a shape of the insulating layer 340 is not limited to that shown in FIG. 2 and may vary.

Referring back to FIG. 2, the pixel-defining layer 240 may be disposed above the thin-film transistor TFT. The pixel-defining layer 240 may be disposed on the via layer 170 and may have an opening for exposing a center portion of the pixel electrode 210. The opening of the pixel-defining layer 240 defines a pixel area of the OLED 200.

The intermediate layer 220 including the EML may be formed in the opening of the pixel-defining layer 240, and the opposite electrode 230 may be formed on the intermediate layer 220 while the opposite electrode 230 extends over the entire surface of the flexible substrate 100.

The thin-film encapsulation layer 400 may be formed on the opposite electrode 230. Although not illustrated, the thin-film encapsulation layer 400 may have a multilayer-structure in which at least one inorganic layer and at least one organic layer are stacked. The thin-film encapsulation layer 400 may be formed on the entire surface of the flexible substrate 100 while the thin-film encapsulation layer 400 covers the OLED 200, and may extend to the peripheral area PA of the flexible substrate 100. In the present exemplary embodiment, the thin-film encapsulation layer 400 extends on the first metal layer 300 so as to cover the first metal layer 300. By doing so, oxygen and moisture that may flow on top surfaces of the first and second insulating layers 130 and 150 disposed on the peripheral area PA of the flexible substrate 100 may be completely blocked.

According to the present exemplary embodiment, the flexible display 1 includes the opening 300a and the first metal layer 300 that is filled in the opening 300a and thus is disposed on the opening 300a, wherein the opening 300a is arranged in the display area DA and penetrates through the first and second insulating layers 130 and 150 so as to surround the display area DA of the flexible substrate 100, so that the penetration path of oxygen and moisture that flow into the display area DA via the side surfaces of the first and second insulating layers 130 and 150 may be blocked in the flexible display 1. Since the thin-film encapsulation layer 400 extends on the first metal layer 300 so as to cover the first metal layer 300, the thin-film encapsulation layer 400 may block penetration of oxygen and moisture that flow on the top surface of the second insulating layer 150 disposed on the peripheral area PA of the flexible substrate 100. Therefore, due to the aforementioned structure of the flexible display 1, oxygen and moisture that flow on top and side surfaces of the first and second insulating layers 130 and 150 formed as organic insulating layers may be completely blocked.

Figure 9:
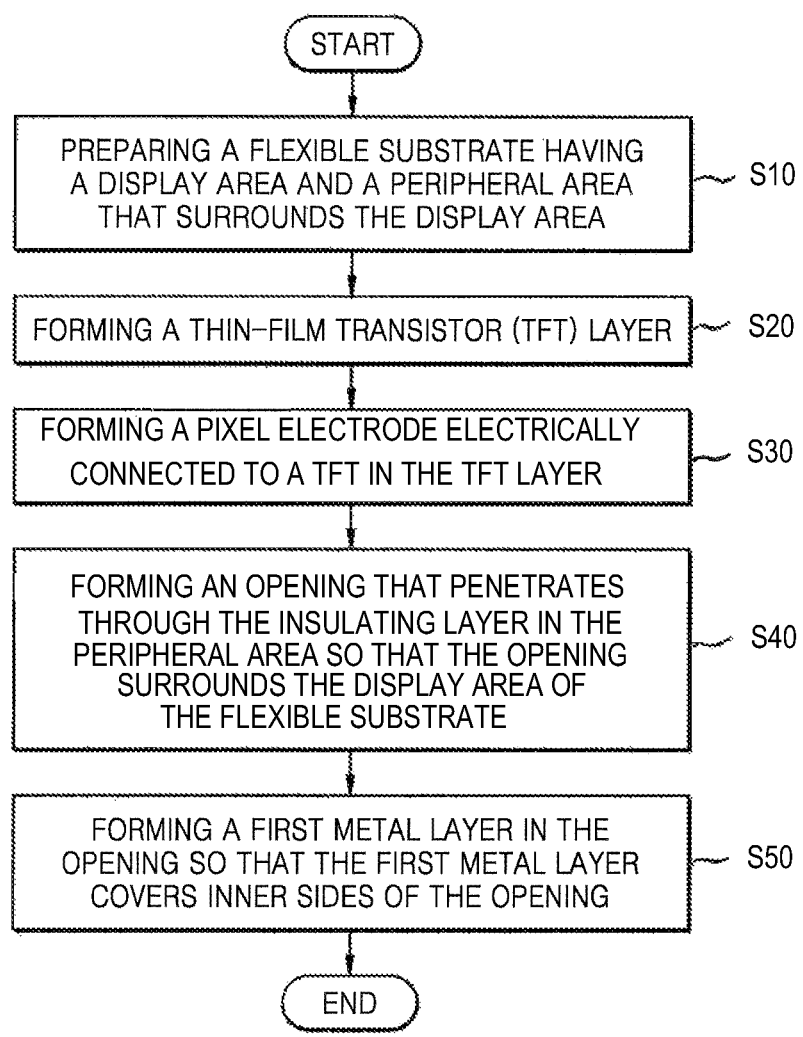
FIG. 9 is a flowchart describing the manufacturing procedure of FIGS. 6-8.

FIG. 9 is a flowchart describing the manufacturing procedure of FIGS. 6-8. First, a flexible substrate having a display area and a peripheral area that surrounds the display area is formed (S10). A TFT layer is formed (S20). A pixel electrode electrically connected to a TFT in the TFT layer is formed (S30). An opening that penetrates through the insulating layer in the peripheral area so that the opening surrounds the display area of the flexible substrate is formed (S40). A first metal layer in the opening so that the first metal layer covers inner sides of the opening is formed (S50). Depending on the embodiment, additional states can be added, others removed, or the order of the states changed in FIG. 9.

According to at least one of the disclosed embodiments, a flexible display and a method of manufacturing the flexible display are provided, whereby external oxygen and moisture may be easily blocked from penetrating a display unit of the flexible display.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

The aforementioned aspects of one or more exemplary embodiments may be realized by using a system, a method, a computer program, or any combination of the system, the method, and the computer program.

While the inventive technology has been described with reference to the figures, it will be understood by those of ordinary skill in the art that various changes in form and details may be made therein without departing from the spirit and scope as defined by the following claims.

What is claimed is:

1. A flexible display comprising:
   a flexible substrate including a display area and a peripheral area that surrounds the display area;
   a thin-film transistor (TFT) layer disposed on the flexible substrate and comprising an insulating layer and a TFT, wherein the insulating layer comprises a first insulating layer and a second insulating layer on the first insulating layer and has an opening that surrounds the display area in the peripheral area;
   a pixel electrode electrically connected to the TFT; and
   a first metal layer formed in the opening and covering inner sides of the opening,
   wherein the TFT comprises a semiconductor layer, a gate electrode having a portion overlapping the semiconductor layer, and source and drain electrodes electrically connected to the semiconductor layer via a plurality of contact holes,
   wherein the first insulating layer is interposed between the semiconductor layer and the gate electrode, and the second insulating layer is interposed between the gate electrode and source and drain electrodes,
   wherein the second insulating layer is formed of an organic material.

2. The flexible display of claim 1, wherein the first metal layer has a closed polygonal form or a closed curve form and penetrates through the insulating layer.

3. The flexible display of claim 1, wherein the first metal layer completely fills in the opening.

4. The flexible display of claim 1, further comprising a buffer layer formed of an organic material or an inorganic material, wherein the buffer layer is interposed between the flexible substrate and the TFT layer, and wherein the buffer layer contacts the first metal layer through the opening.

5. The flexible display of claim 1, further comprising a second metal layer disposed over the first metal layer.

6. The flexible display of claim 5, wherein the second metal layer is formed of the same material as the pixel electrode.

7. The flexible display of claim 5, wherein the flexible display further comprises a first material layer formed of the same material as the semiconductor layer, and wherein the first material layer is interposed between the flexible substrate and the first metal layer.

8. The flexible display of claim 7, wherein a portion of a top surface of the first material layer contacts the first metal layer through the opening.

9. The flexible display of claim 7, wherein the first metal layer is formed of the same material as the source and drain electrodes.

10. The flexible display of claim 7, wherein the insulating layer is interposed between the semiconductor layer and the source and drain electrodes.

11. The flexible display of claim 5, further comprising a first material layer and a second material layer, wherein the first material layer is interposed between the flexible substrate and the first metal layer, wherein the second material layer is interposed between the first and second metal layers.

12. The flexible display of claim 11, further comprising a via layer interposed between the TFT and the pixel electrode, and wherein the first material layer is formed of the same material as the via layer.

13. The flexible display of claim 1, further comprising a thin-film encapsulation layer formed over the pixel electrode, wherein the thin-film encapsulation layer is formed over the entire surface of the flexible substrate and extends over a top surface of the first metal layer so as to cover the first metal layer.

14. The flexible display of claim 1, further comprising a first material layer interposed between the flexible substrate and the first metal layer.

15. A flexible display comprising:
a flexible substrate including a display area and a peripheral area that surrounds the display area;
a thin-film transistor (TFT) layer disposed on the flexible substrate and comprising an insulating layer and a TFT, wherein the insulating layer is formed of an organic material and has an opening that surrounds the display area in the peripheral area;
a pixel electrode electrically connected to the TFT;
a first metal layer formed in the opening and covering inner sides of the opening,
wherein the TFT comprises a semiconductor layer, a gate electrode having a portion overlapping the semiconductor layer, and source and drain electrodes electrically connected to the semiconductor layer via a plurality of contact holes,
wherein the insulating layer is interposed between the semiconductor layer and the source and drain electrodes;
a second metal layer disposed over the first metal layer; and
a first material layer formed of the same material as the semiconductor layer,
wherein the first material layer is interposed between the flexible substrate and the first metal layer.

16. A flexible display comprising:
a flexible substrate including a display area and a peripheral area that surrounds
the display area;
a thin-film transistor (TFT) layer disposed on the flexible substrate and comprising an insulating layer and a TFT, wherein the insulating layer is formed of an organic material and has an opening that surrounds the display area in the peripheral area;
a pixel electrode electrically connected to the TFT;
a first metal layer formed in the opening and covering inner sides of the opening,
wherein the TFT comprises a semiconductor layer, a gate electrode having a portion overlapping the semiconductor layer, and source and drain electrodes electrically connected to the semiconductor layer via a plurality of contact holes,
wherein the insulating layer is interposed between the semiconductor layer and the source and drain electrodes;
a second metal layer disposed over the first metal layer; and
a first material layer and a second material layer, wherein the first material layer is interposed between the flexible substrate and the first metal layer, and wherein the second material layer is interposed between the first and second metal layers.

17. The flexible display of claim 16, further comprising a via layer interposed between the TFT and the pixel electrode, and wherein the first material layer is formed of the same material as the via layer.

18. A flexible display comprising:
a flexible substrate including a display area and a peripheral area adjacent to the
display area;
thin-film transistor (ITT) layer disposed on the flexible substrate and comprising an insulating layer and a TFT, wherein the insulating layer is formed of an organic material and has an opening adjacent to the display area in the peripheral area;
a pixel electrode electrically connected to the TFT; and
a first metal layer formed in the opening,
wherein the TFT comprises a semiconductor layer, a gate electrode having a portion overlapping the semiconductor layer, and source and drain electrodes electrically connected to the semiconductor layer,
wherein the insulating layer is disposed between the semiconductor layer and the source and drain electrodes, and
wherein the insulating layer is disposed between the semiconductor layer and the gate electrode.

19. The flexible display of claim 18, wherein the first metal layer has a closed polygonal form or a closed curve form and penetrates through the insulating layer.

20. The flexible display of claim 18, wherein the first metal layer completely fills in the opening.

* * * * *